(12) United States Patent
Belk et al.

(10) Patent No.: US 6,395,611 B1
(45) Date of Patent: May 28, 2002

(54) INDUCTOR OR LOW LOSS INTERCONNECT AND A METHOD OF MANUFACTURING AN INDUCTOR OR LOW LOSS INTERCONNECT IN AN INTEGRATED CIRCUIT

(75) Inventors: Nathan Belk, Scotch Plains, NJ (US); William Thomas Cochran, Clermont, FL (US); Michel Ranjit Frei, Berkeley Heights, NJ (US); David Clayton Goldthorp, Reiffton, PA (US); Shahriar Moinian, New Providence, NJ (US); Kwok K. Ng, Warren, NJ (US); Mark Richard Pinto, Summit, NJ (US); Ya-Hong Xie, Beverly Hills, CA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/432,725

(22) Filed: Nov. 1, 1999

Related U.S. Application Data
(60) Provisional application No. 60/106,945, filed on Nov. 4, 1998, and provisional application No. 60/124,478, filed on Mar. 5, 1999.

(51) Int. Cl.$^7$ ................................................ H01L 21/20
(52) U.S. Cl. ........................................ 438/381; 438/383
(58) Field of Search ................................ 438/381, 383, 438/382, 388, 390, 395, 268, 402; 384/384

(56) References Cited

U.S. PATENT DOCUMENTS

| | | | | | |
|---|---|---|---|---|---|
| 4,458,158 | A | * | 7/1984 | Maryrand | 307/270 |
| 4,789,645 | A | * | 12/1988 | Calviello et al. | 437/51 |
| 5,091,330 | A | * | 2/1992 | Cambon et al. | 437/62 |
| 5,712,189 | A | * | 1/1998 | Plumton et al. | 437/133 |
| 5,861,336 | A | * | 1/1999 | Reedy et al. | 438/407 |
| 6,153,473 | A | * | 11/2000 | Calafut et al. | 438/268 |

* cited by examiner

Primary Examiner—David Nelms
Assistant Examiner—Thao Le
(74) Attorney, Agent, or Firm—Anthony Grillo

(57) ABSTRACT

An integrated circuit with a buried layer for increasing the Q of an inductor formed in the integrated circuit. The substrate includes a highly doped buried preserving device and latchup characteristics. The inductor may also include an increased thickness conductive layer in the inductor to further increase Q. The present invention is also directed to a low loss interconnect.

12 Claims, 10 Drawing Sheets

FIG. 16
INDUCTOR OR LOW LOSS INTERCONNECT AND A METHOD OF MANUFACTURING AN INDUCTOR OR LOW LOSS INTERCONNECT IN AN INTEGRATED CIRCUIT

CROSS-REFERENCE TO RELATED APPLICATION

This application claims priority of Provisional Application Serial No. 60/106,945 which was filed on Nov. 4, 1998 (Lucent Attorney Docket No. V. D. Archer 1-2-3-22-2-5-20-8-1-16-15-8-10-15); and Provisional Application Serial No. 60/124,478 which was filed on Mar. 15, 1999 (Lucent Attorney Docket No. Belk 7-24-6-14-2-16-10-16.

FIELD OF THE INVENTION

The present invention relates generally to integrated circuits and, more particularly, to an inductor and a method of manufacturing an inductor in an integrated circuit.

BACKGROUND OF THE INVENTION

The integration of high-Q inductors with high-density CMOS technologies faces limitations because of conflicts in substrate requirements. Some CMOS technologies use standard substrates that include a P− doped epitaxial layer formed on a P+ bulk substrate. The P+ bulk substrate has a resistivity as low as $1 \times 10^{19}$ cm$^{-3}$. Inductors fabricated using conventional back-end processes are severely degraded because of eddy current losses in the standard substrate.

For example, inductors formed on standard substrates have been reported having a maximum quality factor Q of approximately three (3). Quality factor Q is a measure of inductor performance. A higher Q signifies a better inductor while a lower Q signifies a worse inductor. Although the P+ epitaxial layer degrades inductor performance, it suppresses latchup and provides impurity gettering in CMOS devices. Therefore, changing to a non-degenerate substrate to increase Q translates into a reduction in device density and possible yield loss. Further, a change to a higher resistivity substrate would cause shifts in device characteristics and result in new design rules to satisfy the new latchup conditions. This would require redesign of existing circuit libraries.

SUMMARY OF THE INVENTION

The present invention provides an integrated circuit with a buried layer for increasing the Q of an inductor formed in the integrated circuit. In one illustrative embodiment, an inductor is formed in an integrated circuit having a substrate that includes a P+ buried layer formed between a P− epitaxial layer and a p bulk substrate. In other words, the substrate includes a highly doped buried layer formed between less doped layers. This provides a high Q inductor while preserving device and latchup characteristics. The present invention further relates to providing an increased thickness metal layer to form the body of the inductor to further increase Q.

The present further relates to a low loss interconnect (transmission line). The interconnect is formed in the same manner as the inductor except that the metal layer is not formed in a spiral shape to form an inductor.

It is to be understood that both the foregoing general description and the following detailed description are exemplary, but are not restrictive, of the invention.

BRIEF DESCRIPTION OF THE DRAWINGS

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures:

FIGS. 12b–12e are schematic diagrams illustrating the steps shown in FIG. 12a;

DETAILED DESCRIPTION OF THE INVENTION

Figure 1:
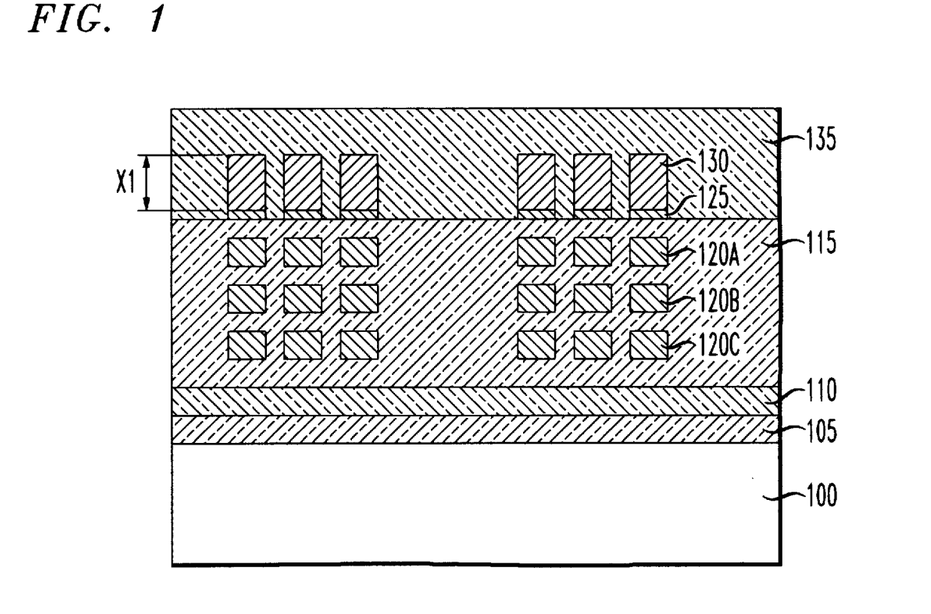
FIG. 1 is a schematic diagram along line 1—1 of the integrated circuit shown in FIG. 2 including an inductor according to an illustrative embodiment of the present invention.
Figure 2:
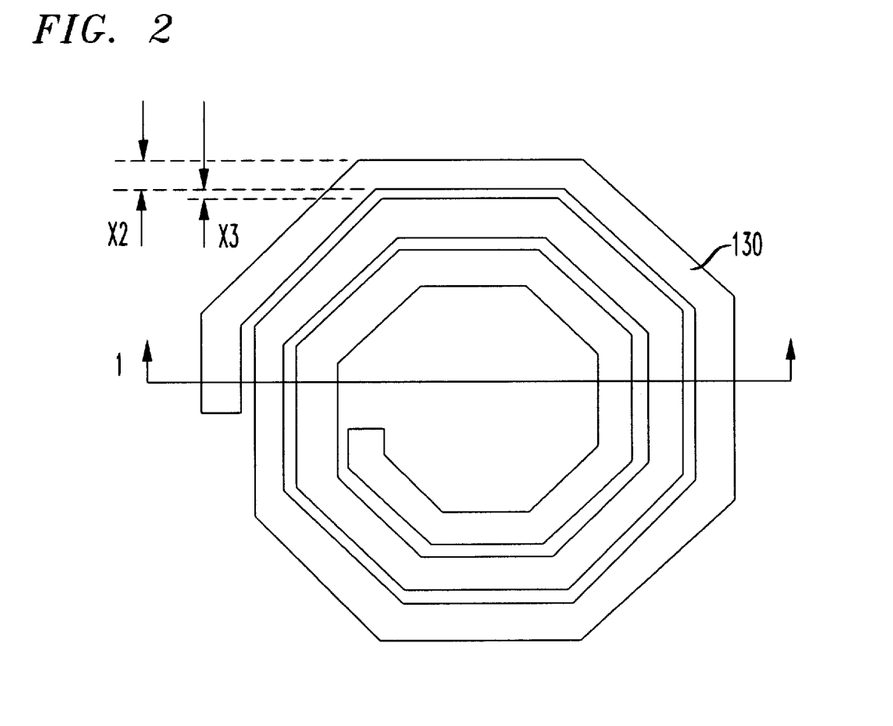
FIG. 2 is a top view of the integrated circuit.

Briefly, the present invention is directed to an integrated circuit including an inductor or transmission line. As is shown in FIGS. 1 and 2, the inductor comprises a buried layer 105 and one or more conductive layers 120a, 120b, 120c, 130. The thickness X1 of the conductive layer 130 may be from 0.5 μm to 6 μm, 1 μm to 5 μm, or approximately 3 μm. The buried layer 105 is positioned between lower doped layer 110 and a lower doped bulk substrate 100. The buried layer 105 is more highly doped than the lower doped layer 110 and the bulk substrate 100. The lower doped layer 110 can be highly resistive and the bulk substrate 100 can be highly resistive. The buried layer 105 is typically more conductive than the bulk substrate 100. The doping of the buried layer 105 is selected to increase the quality factor Q of the inductor and maintain latch-up resistance. One or more of the conductive layers can have an increased thickness to improve Q. In the case of interconnects (transmission lines), the interconnects are formed in the same manner as the inductor including the buried layer 105, the lower doped layer 110, and the lower doped bulk substrate 100 except that the conductive layer (corresponding to layer 130) is not formed in a spiral shape to form an inductor.

The illustrative embodiment provides high Q inductors while preserving latchup characteristics and CMOS current and voltage characteristics. The illustrative embodiment is particularly useful for super chip integration as it enables RF integration while maintaining existing CMOS circuit libraries. The present invention is described in greater detail below with reference to FIG. 3 and continuing reference to FIGS. 1 and 2.

Figure 3:
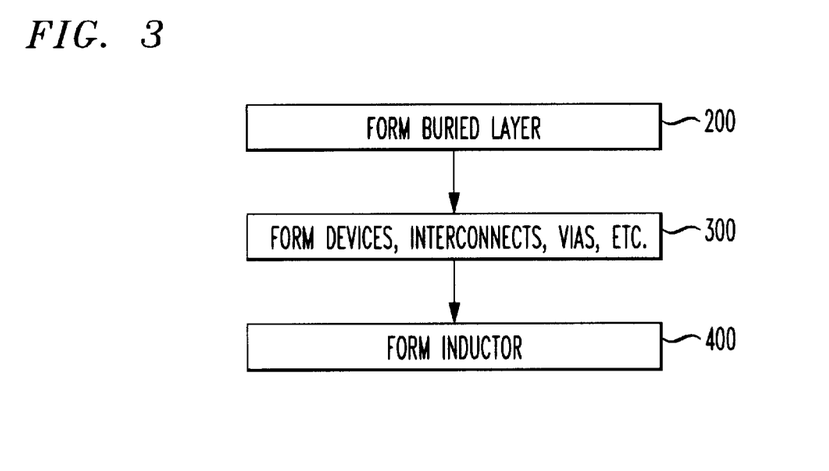
FIG. 3 is a flowchart diagram for manufacturing an integrated circuit according to an illustrative embodiment of the present invention.
Figure 4:
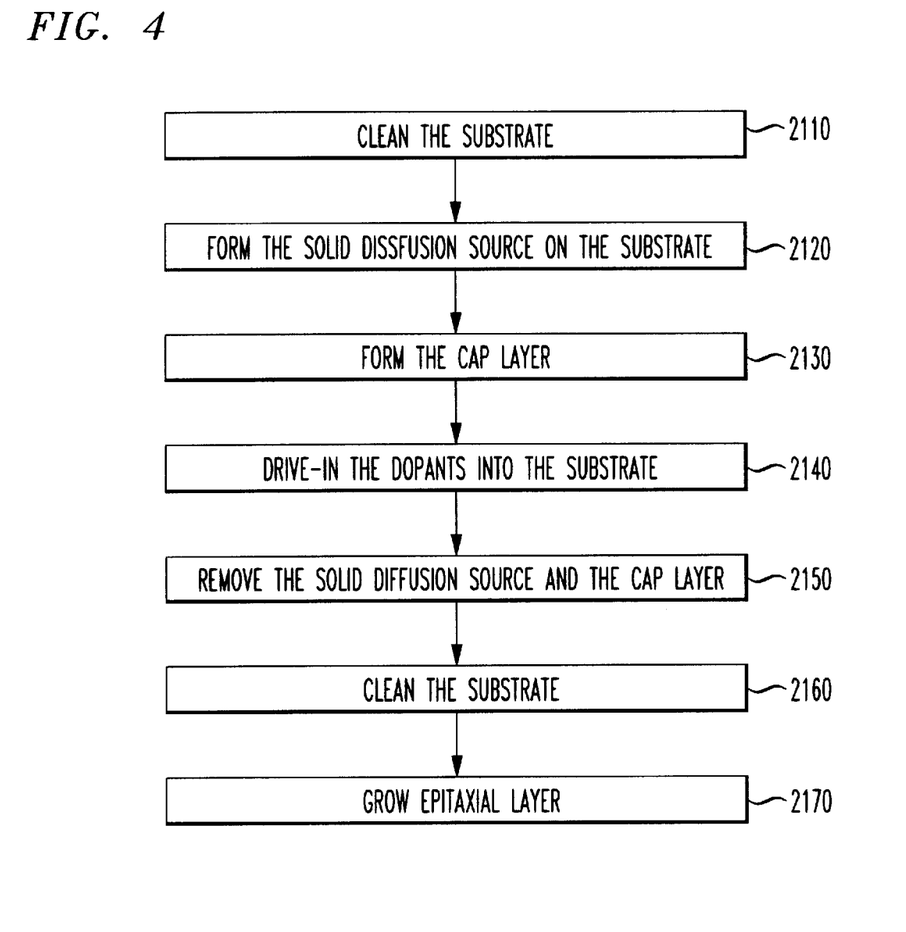
FIG. 4 is a flowchart diagram for forming a buried layer according to a first illustrative embodiment.

FIG. 3 is a flowchart diagram describing the process for forming an integrated circuit including an inductor. At step 200, the buried layer 105 is formed. The process for forming buried layer 105 is described below with reference to FIG. 4. At step 2110, shown in FIG. 4, the bulk substrate 100 is cleaned using, for example, a brush scrub as is well known. The bulk substrate is, for example, a P– silicon substrate that is doped to a concentration less than approximately $1 \times 10^{16}$ cm$^{-3}$ and preferable approximately $1 \times 10^5$ cm$^{-3}$. The dopant may be boron or another suitable dopant. The bulk substrate is also cleaned using, for example, a 100:1 HF clean (a solution containing one hundred parts water to one part hydrofluoric acid).

Figure 5:
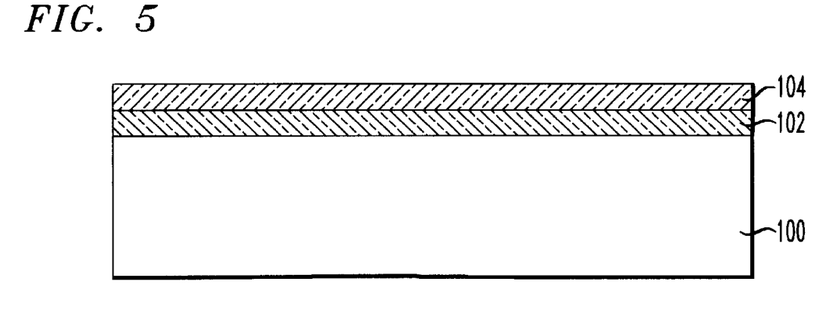
FIGS. 5 and 6 are schematic diagrams illustrating the process of FIG. 4.

At step 2120, a solid diffusion source 102 (shown in FIG. 5) is formed on the substrate 100. The dopant is selected to subsequently form the P+ buried layer 105 having a doping concentration greater than or equal to approximately $1 \times 10^{18}$ cm$^{-3}$ ($\geq 1 \times 10^{18}$ cm$^{-3}$). For example, the diffusion source 102 may be a 5000 Å thick layer of borosilicate glass having an 8% concentration of boron. Next, at step 2130, a cap layer 104 (shown in FIG. 5) is formed on the diffusion source 102 to inhibit out gassing of dopants from the diffusion source 102 during subsequent processing steps. For example, the cap layer 104 may be a 2500 Å thick layer of undoped silicate glass.

Figure 6:
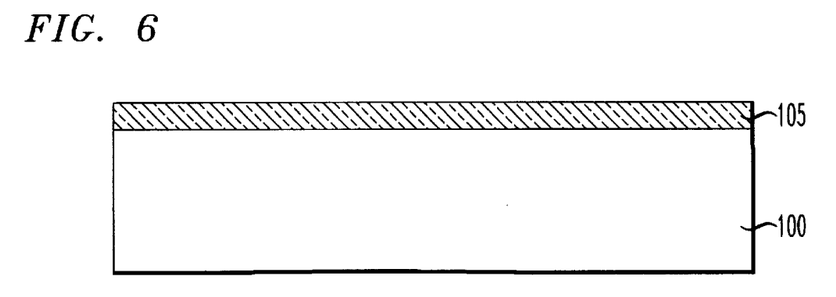

At step 2140, the bulk substrate 100 is annealed to drive the dopants into the bulk substrate 100 from the diffusion source 102 to form buried layer 105 (shown in FIG. 6). For example, the substrate 100 may be heated in a nitrogen (N$_2$) atmosphere for 20 minutes at 950° C. Subsequently, at step 2150, the cap layer 104 and the solid diffusion source 102 are removed (shown in FIG. 6) using a 15:1 HF etch. At step 2160, the substrate 100 is cleaned and, at step 2170, a P– epitaxial layer 110 is formed on the buried layer 105. The P– epitaxial layer is formed using well-known processes. The doping concentration of the P– epitaxial layer is less than $1 \times 10^{16}$ cm$^{-3}$ or approximately $1 \times 10^{15}$ cm$^{-3}$. The thickness of the epitaxial layer 110 is between approximately 1 μm to 10 μm, 1 μm to 5 μm, 1 μm to 3 μm, 2 μm, or 4 μm. The thickness of the buried layer 105 is between approximately 1 μm to 4 μm and preferably 3 μm.

Figure 7:
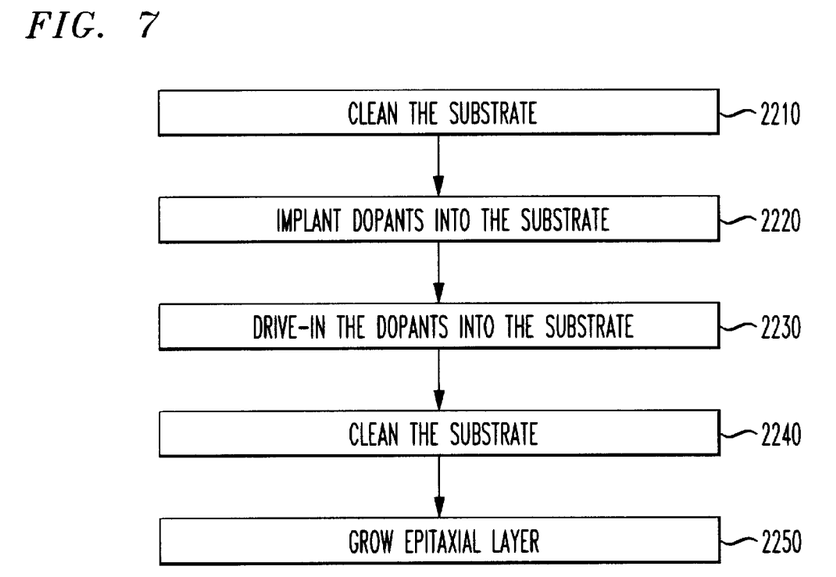
FIGS. 7 and 8 are flowchart diagrams for forming the buried layer according to second and third illustrative embodiments.

FIG. 7 illustrates an alternative process for forming the buried layer 105. At step 2210, the substrate 100 is cleaned using, for example, a brush scrub. The substrate is, for example, silicon that is doped with boron to a concentration of less than $1 \times 10^{16}$ cm$^{-3}$ and preferably approximately example, a 100:1 HF clean.

At step 2220, dopants are implanted into the substrate using standard practices. The dopant is boron implanted at an energy of 5 KeV. The dopant is selected to form a P+ buried layer 105 having a doping concentration greater than $1 \times 10^{18}$ cm$^{-3}$. Next, at step 2230, the substrate 100 is annealed to drive the dopants into the substrate 100 to form buried layer 105. Subsequently, at step 2240, the substrate 100 is cleaned and, at step 2250, a P– epitaxial layer 110 is grown on the buried layer 105. The P– epitaxial layer is formed using well-known processes. The doping of the P– epitaxial layer is less than $1 \times 10^{16}$ cm$^{-3}$ and preferably approximately $1 \times 10^{15}$ cm$^{-33}$.

Figure 8:
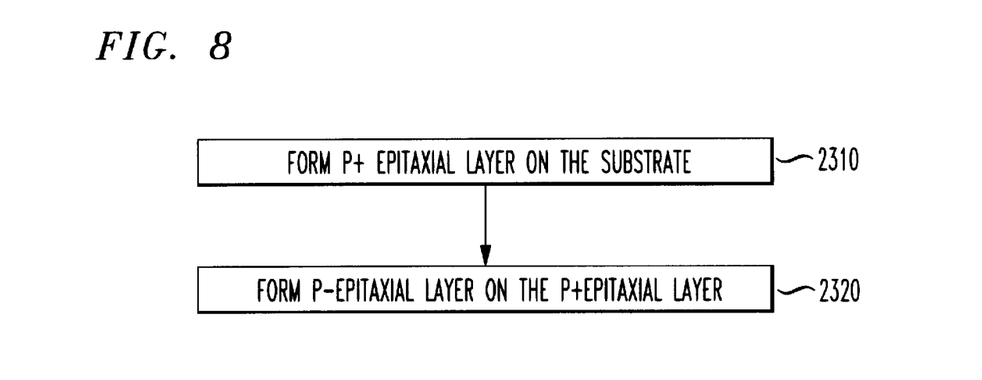

FIG. 8 illustrates a further alternative embodiment to form buried layer 105. At step 2310, a P+ epitaxial layer is grown on the substrate 100. At step 2320, a P– epitaxial layer 110 is grown on the P+ epitaxial layer. The P+ epitaxial layer forms the buried layer 105. The P+epitaxial layer may be formed in the same chamber using the same process to form the P– epitaxial layer except that the doping of the layers is changed. Both the P+ and P– epitaxial layers are, for example, epitaxially grown silicon where the P+ epitaxial layer is more heavily doped with boron. This is accomplished by varying the amount of boron in the source gas when forming the epitaxial layers. The doping of the buried layer is greater than $1 \times 10^{18}$ cm$^{-3}$ and the doping of the P– epitaxial layer is approximately $1 \times 10^{15}$ cm$^{-3}$.

The two step process shown in FIG. 8 provides a simplified process to produce a substrate that can be used to form an inductor having a higher Q. As a result, the speed of producing the substrates may be increased while reducing the costs. Further, the performance of the substrate can be easily tailored to improve latch-up by thickening the buried layer 105. Alternatively, Q may be increased by decreasing the thickness of the buried layer 105. This two step process may be performed in a single epitaxial chamber.

Figure 9:
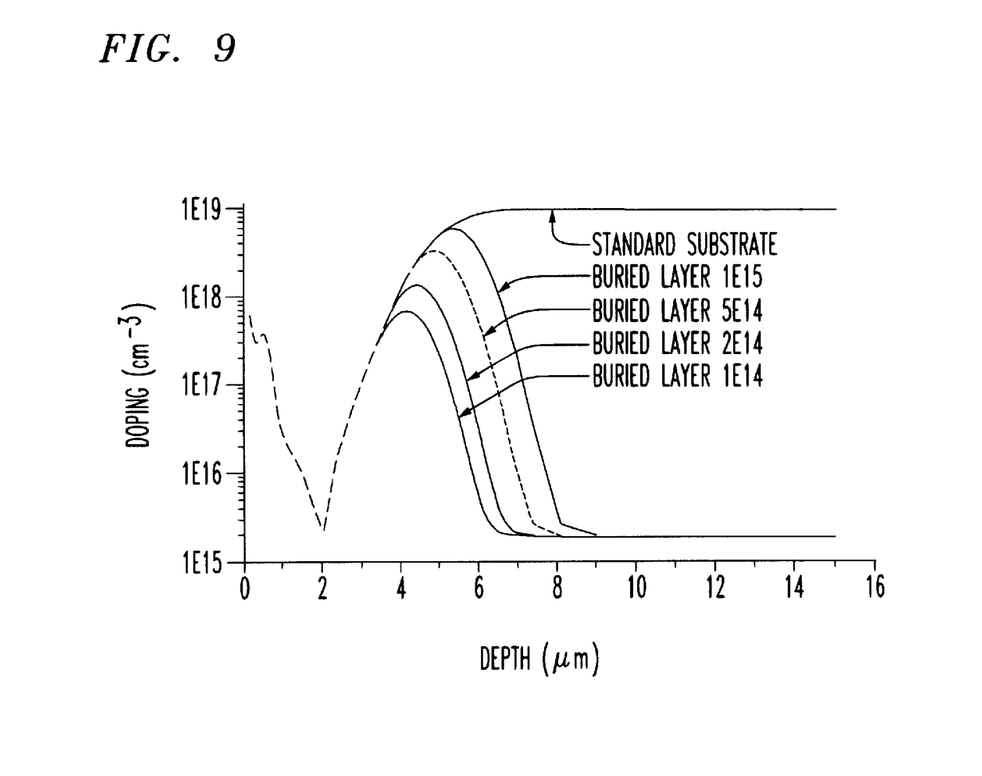
FIGS. 9 and 11 are charts illustrating different aspects of the present invention.

FIG. 9 compares the vertical doping profiles of a standard substrate and a modified substrate having four different doping concentrations. A modified substrate is the combination of bulk substrate 100, buried layer 105, and lower doped layer 110 produced using one of the methods above. The standard substrate is one that includes a bulk substrate and an epitaxial layer as is known in the prior art. The buried layer 105 is positioned near the interface of the bulk substrate 100 and the lower doped layer 110. The buried layer is formed so that the original profile of the standard substrate is reproduced to, for example, a depth of 2 to 5 μm, 2 to 4 μm, or 3 to 4 μm. As a result, transistor current-voltage (I-V) characteristics remain insensitive to the far regions of the substrate 100.

The dopant dose in the buried layer 105 is adjusted as a trade-off between latchup immunity and inductor performance (an increase in Q). A lower dose in the buried layer 105 results in increased shunt resistance and lower latchup immunity because the buried layer 105 contributes to shunting of the base-emitter junction of a lateral npn transistor formed on the substrate.

Figure 11:
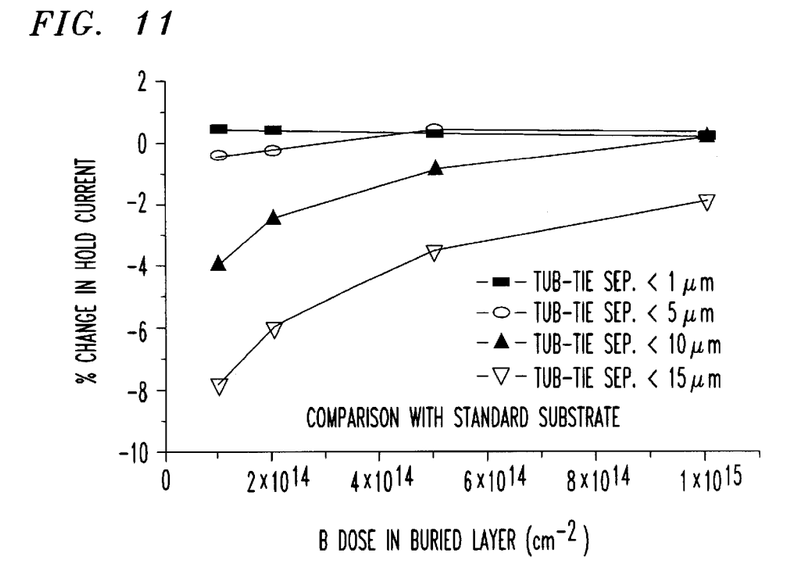

The simulated dose dependence of hold current is illustrated in FIG. 11. A dose of $1 \times 10^{15}$ cm$^{-2}$ is sufficient to preserve latchup for a worst case situation where the devices are closely spaced and tub ties are separated by 10 μm. The exact dose may vary depending on layout and design of the integrated circuit.

Returning to FIG. 3, at step 300, transistors, vias and interconnects are formed to produce a desired integrated circuit. The processes used to produce the other component parts of the integrated circuit are well known and omitted for brevity sake. In addition, tubs (p doped tubs and n doped tubs) may be formed in the epitaxial layer using well know processes. A "tub" (alternatively referred to as a "well") is a region that is doped separately than the rest of the substrate.

The inductor may be formed from one or more interconnected conductive layers 120a, 120b, 120c, 130. Where more than one conductive layer is used, interconnection (not shown) layers (vias and plugs) between the conductive layers and through the inter-level dielectric layers 115 are provided. The conductive layers are typically formed from metals such as aluminum and tungsten. These layers are deposited and patterned using standard well-known processes except for conductive layer 130. Conductive layer 130 may be the same as or different from the other conductive layers 120a, 120b, 120c. The process to form patterned conductive layer 130 having a thickness of 3 μm is described below with reference to FIGS. 12a–12e.

Figure 12A:
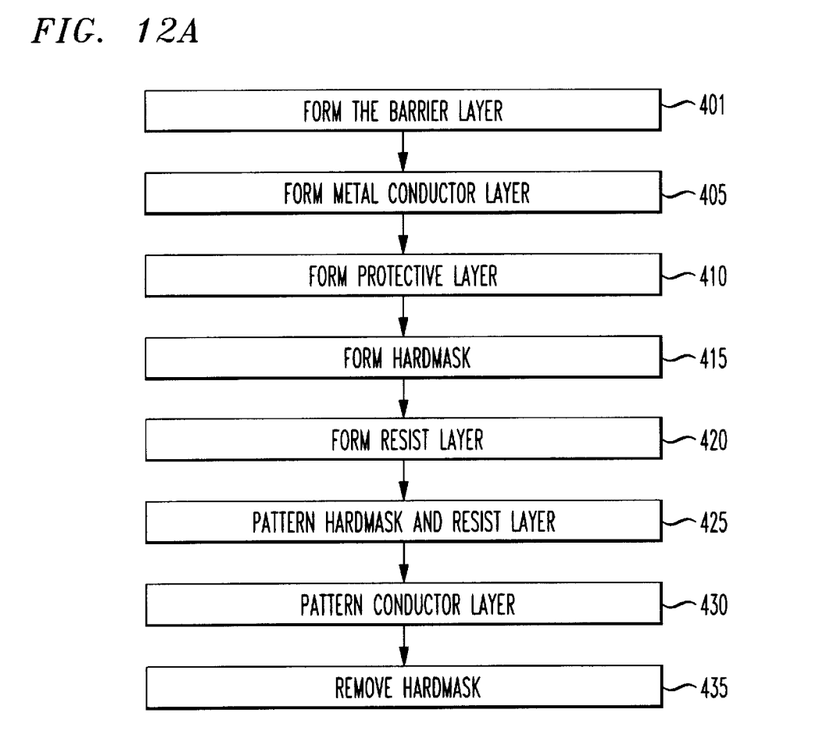
FIG. 12a is a flow chart diagram illustrating the formation of a conductive layer according to an illustrative embodiment of the present invention.
Figure 12B:
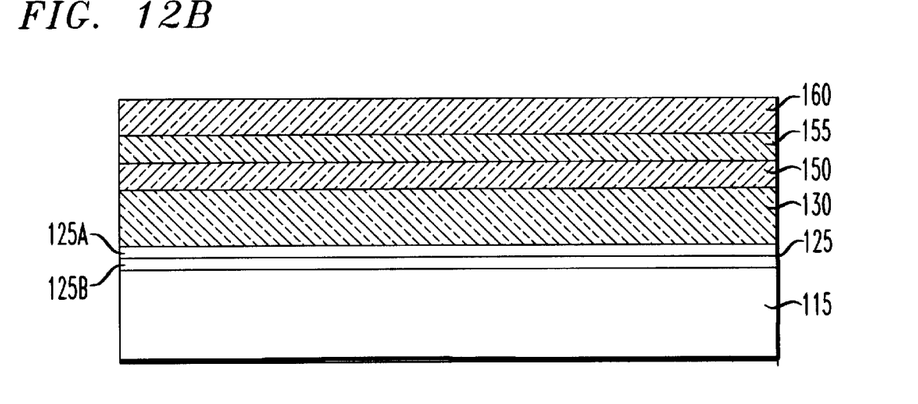
Figure 12C:
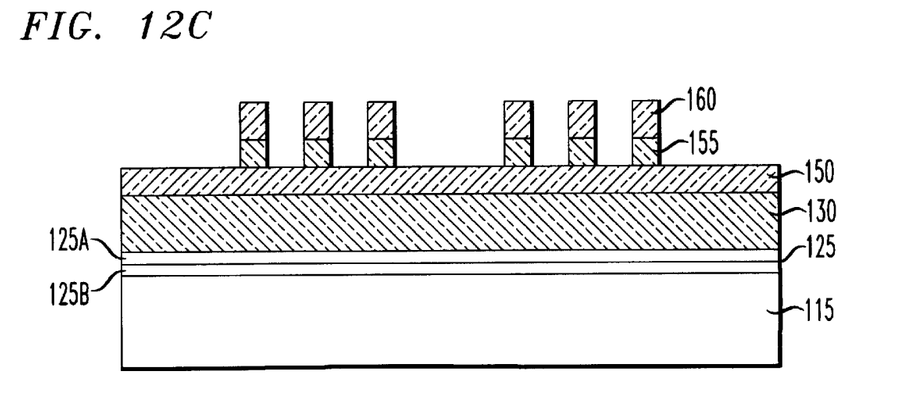
Figure 12D:
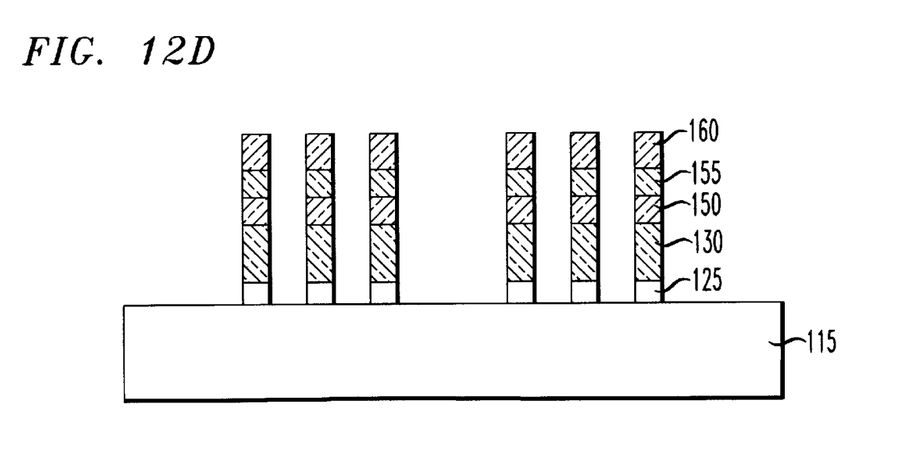
Figure 12E:
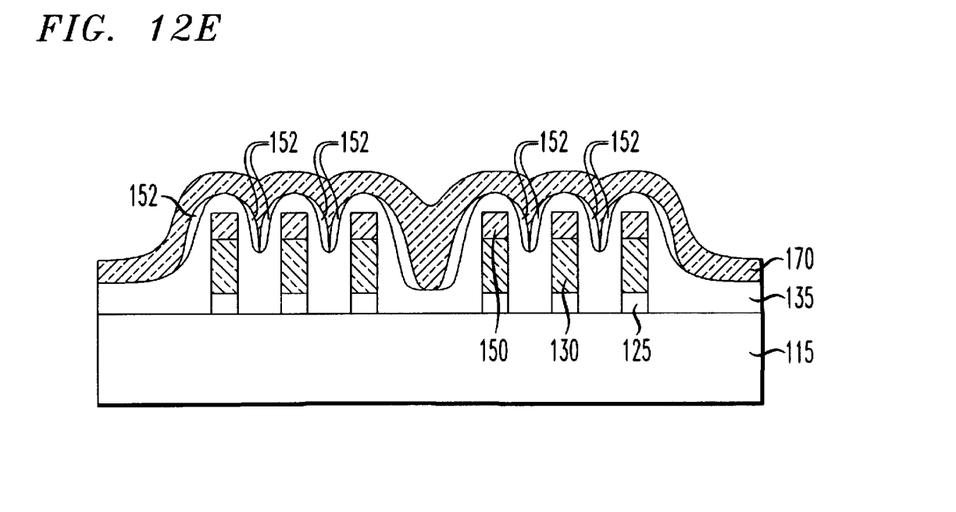

At step 401, a barrier layer 125 is formed over the oxide layer 115. The barrier layer 125 is a barrier between the metal conductive layer and the prior interconnection layer (vias and plugs). An illustrative barrier layer 125 is a titanium nitride layer 125a formed on a titanium layer 125b. The thickness of the titanium nitride layer 125a is, for example, 600 Å. The thickness of the titanium layer 125b is, for example, 375 Å. At step 405, the conductive layer 130 is formed on the barrier layer 125. The conductive layer 130 is, for example, aluminum. The thickness of the conductive layer 130 is up to approximately 5 μm. The thickness of the conductive layer 130 may also be approximately 1 μm to 5 μm or approximately 2 μm to 4 μm. Further, the thickness of the conductive layer 130 may be approximately 3 μm.

At step 410, a protective layer 150 is formed on the conductive layer 130. The protective layer 150 forms a barrier between the conductive layer 130 and the hardmask that is to be formed on the conductive layer 130. The protective layer 150 is, for example, TiN formed to a thickness of approximately 1000 Å. At step 415, a hardmask layer 155 is formed on the protective layer 150. The material for the hardmask is selected to be resistant to the etching process used to etch the conductive layer 130. The hardmask layer 155 comprises, for example, tungsten which is deposited using sputtering or other well-known deposition techniques. The thickness of the hardmask layer 155 is approximately 5000 Å.

At step 420, a resist layer 160 is formed on the hardmask layer 155 and patterned. At step 425, a pattern is formed in the resist layer 160 and is transferred to the hardmask layer 155 by etching. Subsequently, at step 430, the pattern formed in the resist layer 160 and the hardmask layer 155 is transferred to the conductive layer 130 by etching. At step 435, any remaining portion of the resist layer 160 is removed. An etch is then performed to remove excessive sodium and the remaining portion of the hardmask layer 155, and the substrate is cleaned using well-known processes.

Finally, the patterned conductive layer 130 is encapsulated by a cap layer 135. The cap layer is, for example, an oxide deposited using a process that provides good step coverage and gap fill. An exemplary oxide is high-density plasma (HDP) oxide having a thickness of 8000 Å. Subsequently, a silicon nitride (SiN) layer is formed on the HDP oxide. Typically, the width X2 (FIG. 2) of the patterned conductive layer lines is 10 μm, spaced apart at a width X3 of 2 μm.

Figure 12F:
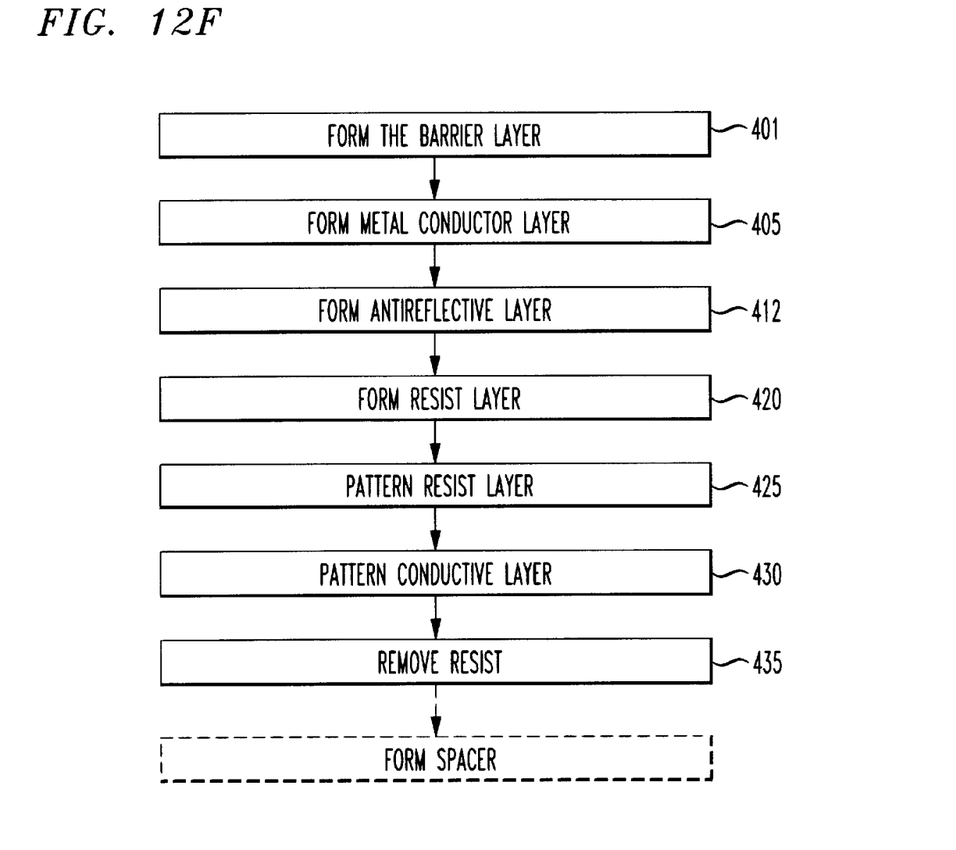
FIG. 12f is a flow chart diagram illustrating the formation of a conductive layer according to a further illustrative embodiment of the present invention.

Alternatively, the patterned conductive layer 130 may be formed using an alternative process that does not use a hardmask. This process is shown in FIG. 12f and is the same as the process in FIG. 12a except that steps 410 and 415 are eliminated and replaced by an antireflective layer forming step 412. The antireflective layer is, for example, TiN formed to a thickness of approximately 250 Å. In this case, the resist is formed directly on the protective layer. The resist is formed to a thickness of 2 μm. A highly aluminum selective etch is used to etch layers 125, 130. In addition, a PETEOS spacer 152 may be formed as part of the cap layer 135. A blanket layer of PETEOS approximately 1 μm thick is formed and etched to form the spacers 152 on the side walls of the conductive layer 130 that are encapsulated with the cap layer 135. Subsequently, a silicon nitride (SiN) layer 170 is formed on the HDP oxide.

Experiment

An inductor was formed using a quarter (0.25) micron CMOS process that differed from a typically 0.25 CMOS process in two aspects. First, the substrate 100, previously obtained by growing several microns of P− epitaxial silicon over a P+ bulk silicon substrate was modified to include a $2\times10^{15}$ cm$^{-3}$ bulk substrate 100, a buried layer 105 formed by implantation and diffusion, and an epitaxial layer 110 on the buried layer. No lithography is involved for these steps. The doping concentration of the bulk substrate was approximately $1\times10^{16}$ cm$^{-3}$. The doping concentration of the buried layer had a peak concentration on the order of $5\times10^{18}$ cm$^{-3}$. The doping concentration of the epitaxial layer was greater than $1\times10^{15}$ cm$^{-3}$.

Second, a 3 μm thick fifth level of metal (this layer corresponds to conductive layer 130) was added to a 4-level aluminum back-end (an integrated circuit containing four other layers of metallization). The 5$^{th}$ level uses relaxed lithographic design rules that are sufficient for inductor layouts.

Figure 14:
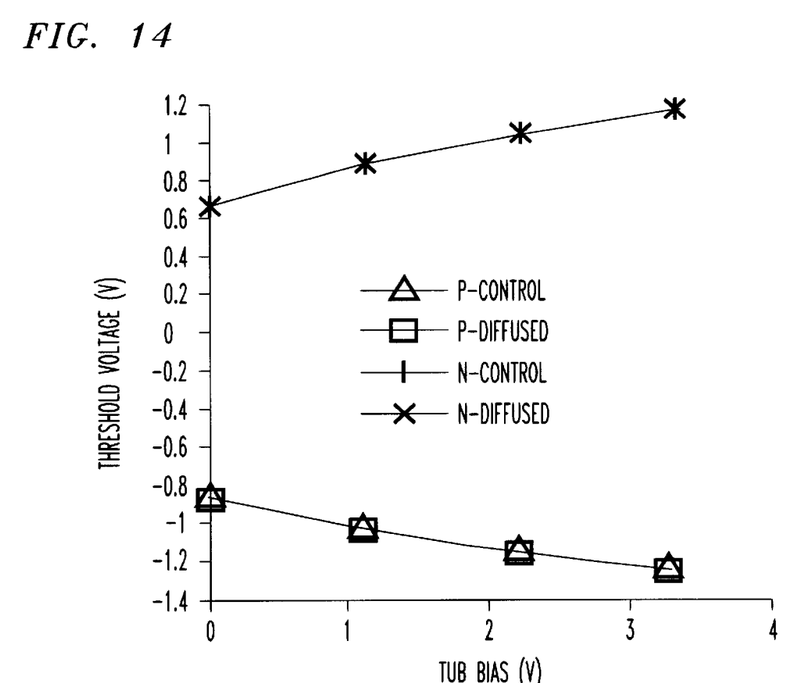
Figure 15:
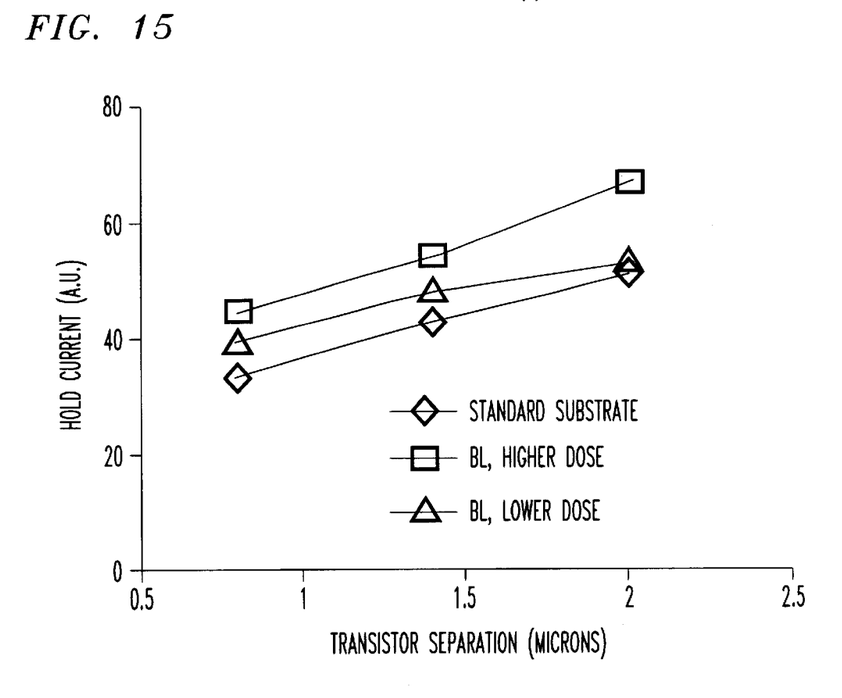

As is shown in FIG. 14, measurements on MOS devices formed on the modified substrate showed no significant changes in the tub bias dependence of the threshold voltage. As is shown in FIG. 15, latch up hold current was measured as a function of transistor separation. The devices fabricated on the modified substrate had better hold current than the standard substrate. The hold current also decreased for smaller dopant doses in the buried layer 105.

Figure 10:
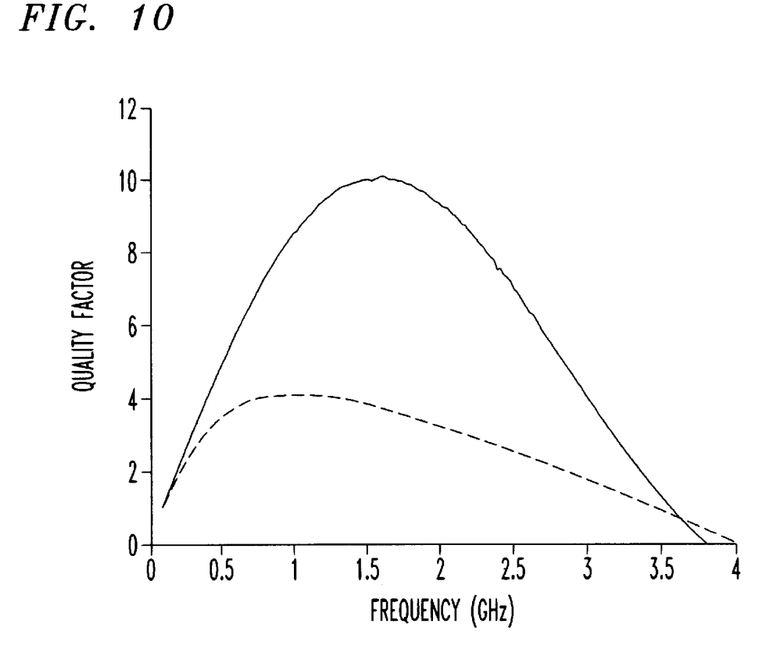
FIGS. 13, 14, 15, and 10 are charts illustrating experimental data of an inductor formed according to an embodiment of the present invention.
Figure 13:
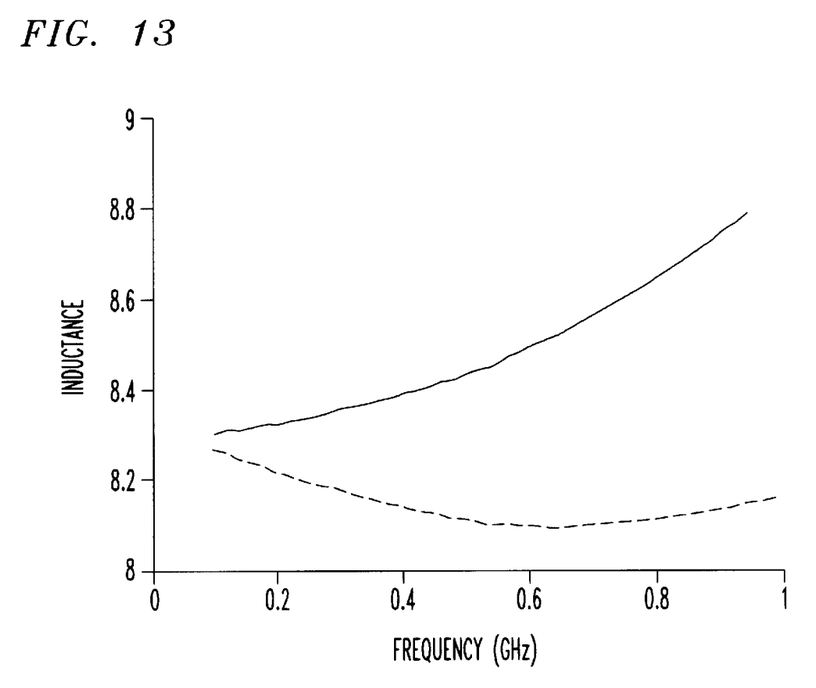
Figure 16:
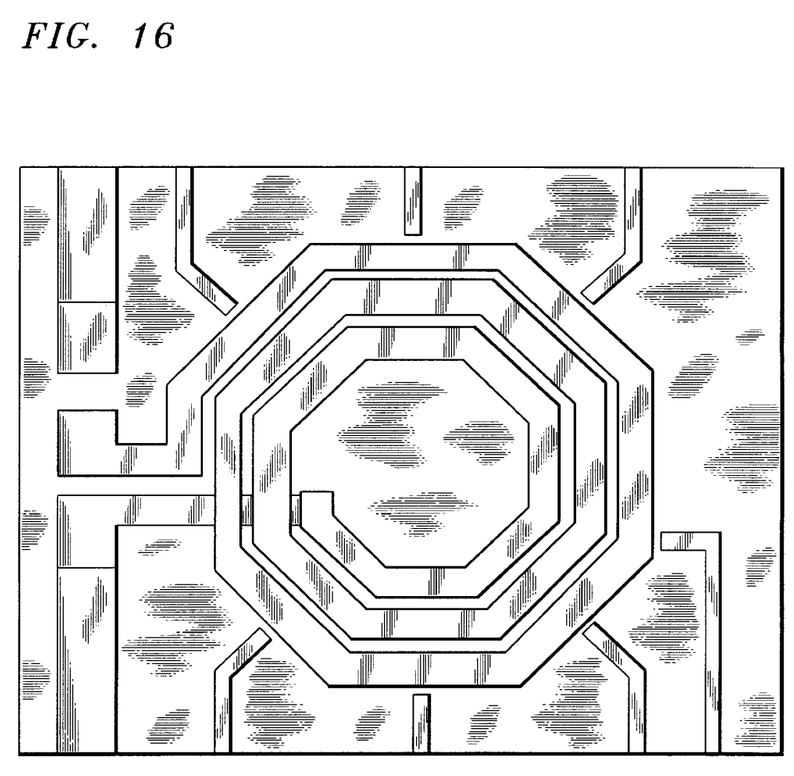
FIG. 16 is a perspective view of the experimental inductor.

FIG. 16 is a micrograph top view of the finished inductor. As is shown in FIG. 10, the peak Q of an 8 nH inductor increased from 4 nH in a standard substrate to 10 nH for the modified substrate, with the position of the peak increasing from 0.8 GHz to 1.5 GHz. As is shown in FIG. 13, the typical decrease of L with increasing frequency, observed for a standard substrate and indicative of substrate losses, does not occur in the modified substrate. The results demonstrate that the modified substrate can be used to fabricate high-Q inductors while preserving CMOS I-V and latchup characteristics.

Although the invention has been described with reference to exemplary embodiments, it is not limited to those embodiments. Rather, the appended claims should be construed to include other variants and embodiments of the invention that may be made by those skilled in the art without departing from the true spirit and scope of the present invention.

What is Claimed:

1. A method of manufacturing an integrated circuit comprising the steps of:
   (a) forming a buried layer between a first and second doped layer wherein said buried layer has a dopant concentration greater than a dopant concentration of the first and second layers; and
   (b) forming an inductor above the buried layer, the buried layer forming a portion of the inductor.

2. The method of claim 1 further comprising adjusting a quality factor Q of the inductor by varying the doping concentration of the buried layer.

3. The method of claim 1 further comprising providing the inductor having a thickness X greater than 0.5 μm.

4. The method of claim 3 wherein the thickness X is 0.5 μm ≤ X ≤ 6 μm.

5. The method of claim 3 wherein the thickness X is 2 μm ≤ X ≤ 5 μm.

6. The method of claim 3 wherein the thickness X is approximately 3 μm.

7. The method of claim 1 wherein the buried layer has a peak doping concentration greater than or equal to $1\times10^{18}$ cm$^{-3}$.

8. The method of claim 7 wherein the peak doping concentration is approximately $1\times10^{18}$ cm$^{-3}$.

9. The method of claim 1 wherein the doping concentrations of the first and second layers are less than $1\times10^6$ cm$^{-3}$.

10. The method of claim 9 wherein the doping concentrations of the first and second layers are approximately $1\times10^5$ cm$^{-3}$.

11. A method for forming an integrated circuit including a buried layer (e.g., 105) comprising:

forming a first epitaxial layer over a substrate;

forming a second epitaxial layer on the first epitaxial layer, the first epitaxial layer having (1) the same conductivity type as the second epitaxial layer and (2) a peak doping concentration greater than the average doping concentration of the second epitaxial layer and the substrate; and forming an inductor over the second epitaxial layer such that the first epitaxial layer forms a portion of the inductor.

12. A method of forming an integrated circuit comprising the steps of:

(a) forming a buried layer between first and second doped layers each having a dopant, wherein the buried layer has the dopant and a dopant concentration greater than a dopant concentration of said first and second layers; and (b) forming a conductive layer above the buried layer, the buried layer and the conductive layer forming an inductor.

* * * * *